United States Patent
Nooralahiyan

(12) 
(10) Patent No.: US 6,819,731 B1
(45) Date of Patent: Nov. 16, 2004

(54) FREQUENCY SEARCHING METHOD AND APPARATUS

(75) Inventor: Amir Nooralahiyan, Bramhope (GB)

(73) Assignee: Pace Micro Technology Plc., Shipley (GB)

( * ) Notice: Subject to any disclaimer, the term of this patent is extended or adjusted under 35 U.S.C. 154(b) by 674 days.

(21) Appl. No.: 09/589,243

(22) Filed: Jun. 7, 2000

(30) Foreign Application Priority Data

Jun. 8, 1999 (GB) .............................. 9913154

(51) Int. Cl.[7] .............................................. H04L 23/00
(52) U.S. Cl. ..................... 375/377; 708/311; 455/166.1
(58) Field of Search ............................... 708/309, 311; 455/161.1, 168.1, 62, 150.1, 179.1, 186.1, 166.1; 375/326, 377

(56) References Cited

U.S. PATENT DOCUMENTS

| | | | | |
|---|---|---|---|---|
| 5,128,625 | A | * 7/1992 | Yatsuzuka et al. | .......... 327/156 |
| 5,666,062 | A | * 9/1997 | Takahashi et al. | .......... 324/753 |
| 5,699,385 | A | 12/1997 | D'Sylva et al. | ............. 375/344 |

FOREIGN PATENT DOCUMENTS

| JP | 2000-134174 | * 5/2000 | | |
|---|---|---|---|---|
| WO | WO 99/26339 | 5/1999 | ............. | H03J/7/02 |

OTHER PUBLICATIONS

Derwent Publication No. 200–393125, Derwent Week 200034, Orthogonal frequency division multiplex transmission system receiver for domestic broadcast system, has microprocessor to indicate detected frequency of analog carrier signal.*

* cited by examiner

Primary Examiner—Jean B. Corrielus
(74) Attorney, Agent, or Firm—Head, Johnson & Kachigian

(57) ABSTRACT

The invention provides a method for searching the frequency range of a digital data receiving device, said method including the steps in one embodiment of firstly identifying and disregarding analogue carrier frequencies in the range, then proceeding to estimate the initial starting frequency for a digital carrier by dynamic real-time pre-processing of the spectrum profile and then obtaining successive samples of the frequency range from the start position for the carrier until the center frequency for the carrier is located. In one embodiment the method includes the prediction of the center frequency estimations of all digital carriers for respective channels in the range prior to the search commencing. The method reduces the possibility of locking to analogue carriers, and can reduce the time required to perform a search in comparison to the current digital carrier frequency "search & lock" procedure.

8 Claims, 3 Drawing Sheets

FREQUENCY SEARCHING METHOD AND APPARATUS

CROSS-REFERENCE TO RELATED APPLICATIONS

This application claims priority to British Application No. 9913154.2 filed 08 Jun. 1999.

BACKGROUND OF THE INVENTION

The invention to which this application relates is a method for undertaking a search for a carrier frequency especially, but not exclusively, in relation to digital tuners.

Conventionally the method for undertaking a frequency searching procedure on digital tuners follows the known steps of scanning the entire frequency range of the tuner, typically starting from the minimum frequency value through to the maximum frequency value.

This search reveals whether a lock, or signal, is detected and when a carrier frequency "lock" is detected, the corresponding parameters of the lock such as centre frequency and symbol rates are determined and stored. The search is continued through the frequency range for all the carrier frequencies in the range.

For Zero interference (IF) the frequency of the local oscillator can typically be within the tolerance of the carrier frequency and the symbol rate obtained corresponds to the flat region of the frequency response centred on the carrier frequency. When the carrier frequency is close to the incoming frequency, the carrier signal lies in the "pull-in" range of the PLL and the loop is phased locked.

In practice it is possible for this searching procedure, which is searching for frequency carriers in a digital tuner, to mistakenly lock to an analogue carrier which gives an incorrect reading, wastes time in the searching procedure and is inefficient. In addition to the above, a false lock can occur on digital carriers when phase lock has been detected but the correct control frequency has not been reached. This situation can occur in QPSK tuners for frequency offsets that are multiples of 1/4T where T is the QPSK symbol duration. Offsets that are not multiples of 1/4T are difficult to predict.

SUMMARY OF THE INVENTION

The aim of the present invention is to provide a method for searching which allows for the searching of digital carrier frequency locations in a frequency range in an efficient, timely manner.

In a first aspect of the invention there is provided a method for searching the frequency range of a device said method including the steps of estimating the initial starting frequency for a digital carrier by dynamic real-time pre-processing of the spectrum profile and then obtaining successive samples of the frequency range from the start position for the carrier until the centre frequency for the carrier is located.

Typically the start point estimation and search for the location for the centre frequency is repeated for each digital carrier in the frequency range.

The subsequent use of centre frequency estimation of each digital carrier by overall pattern analysis of their corresponding frequency response also allows a reduction in the search time as not all of the frequency range needs to be searched in a progressive manner as is currently the case.

The solution can be accomplished in one embodiment by employing general pattern recognition techniques, one example of which is Neurocomputing utilizing neural net techniques, that is, a computer architecture in which processing can learn by trail and error, in which the each apparatus and system is pre-programmed to be able to distinguish and reject analogue carrier frequencies which are found in, for example, digital tuners and subsequently estimate the local oscillator locking frequency for the digital carriers. The progressive frequency estimation is achieved by an overlapping windowing function in which the parameters in each overlapping window constitute a subset of the input vector to the system. It should however be clear that any suitable general pattern recognition techniques can be used as required.

The use of the successive samples allows intra-layer propagation of input parameters in each layer to develop an integrated representation of the spectral profile for the digital carrier.

By training the system to recognise and ignore analogue carrier profiles which tend to have a different profile than digital carriers, and then subsequently estimating the initial Local Osc. (LO) frequency for lock within the specified tolerance or very close estimation prior to the search routine and which estimation acts as the start point from which the search begins for each digital carrier, and which functions can be performed simultaneously, so the search can be performed more efficiently and quickly than with the conventional searches which progressively move through the frequency range.

In one embodiment the system can predict the centre frequency estimations of all digital carriers for respective channels and hence the start position for the search for each digital carrier, prior to the search commencing. Indeed, in one preferred embodiment there need not be search performed for those digital carriers where the estimated centre frequency value lies within the tolerances of the predesignated centre frequency value for that carrier.

The system of this invention therefore reduces the possibility of locking to analogue carriers, and has the potential of significantly reducing the time required to perform a search in comparison to the current digital carrier frequency "search & lock" procedure.

In an alternative embodiment a simpler technique can be utilised which involves the use of the estimated parameters in the process to refer to a table of information and, from that information the estimated digital carrier frequency value can be obtained. These tables of information are generally known as "look-up" tables.

In a further aspect of the invention there is provided a method for searching the frequency range of a digital data receiving device, said method including the steps of, estimating the initial starting frequency for a digital carrier in the range by dynamic real-time pre-processing of the spectrum profile and then locating the centre frequency for the carrier and identifying and disregarding analogue carrier frequencies in the range.

Typically by first distinguishing between analogue and digital carriers and ignoring or rejecting the analogue carriers so the time for the search of the frequency range can be considerably reduced.

DETAILED DESCRIPTION OF THE PREFERRED EMBODIMENT

The invention is described with reference to a digital tuner 1 for use with a broadcast data receiver for receiving broadcast digital data 2 from a remote source and said receiver allows for the processing of the data, decoding of the data and the generation of video and/or audio and/or auxiliary data via a television set, for example, among other possible functions. It should however be noted that the invention has potential uses in other areas where a search for digital carriers is required to be performed over a frequency range and one other known area of application could be with mobile phone/facsimile apparatus.

In the example described herein, a Multi-Layer Perceptron (MLP) 4 network system is provided and is pre-programmed to identify and reject analogue carrier frequencies which are identified in the frequency range to be searched. A pattern recognition technique is used and in the example set out a semi-dynamic time-delay neural network system (TDNN) 5 is provided to be used to estimate and identify the lock frequencies for the digital carriers in the frequency.

In use the output of the MLP 4 needs to approach a hard-limiting function for clear-cut pattern classification purposes, while the output of the TDNN 5 needs to be a stable continuous function with interpolation capability for pattern association. The following is a brief description of a feasible implementation of this invention using the two said networks.

Figure 1:
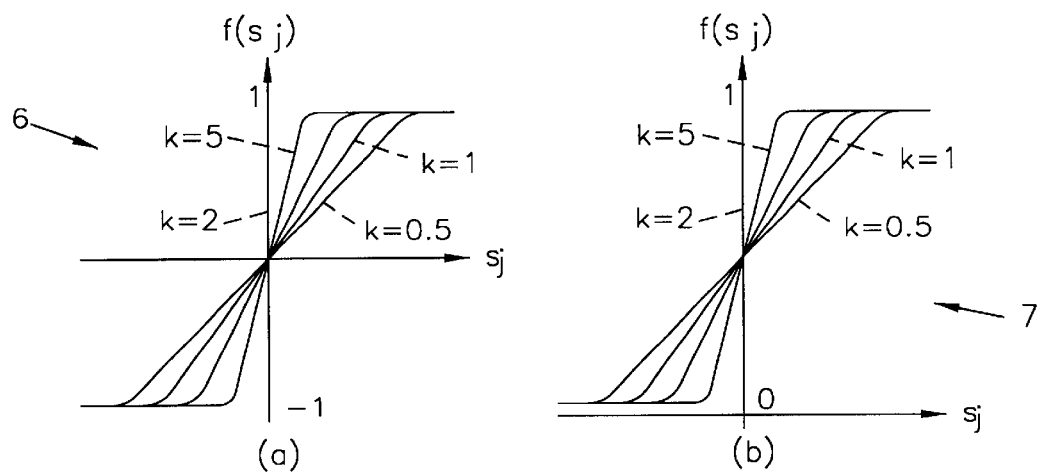
FIGS. 1a and 1b illustrate a bipolar sigmoid function and a unipolar sigmoid function of the present invention.

One of the requirements for the MLP 4 is to incorporate a nonlinear thresholding function that approaches a hard-limiting function without compromising the continuous differentiability required by the back-propagation training algorithm. This can be achieved by increasing the gradient of the output (sigmoid) thresholding function as shown in FIG. 1.

The output of the MLP is a non-linear function of the weighted sum of all the inputs and is represented by Equation 1.

$$o_j = f(s_j) \text{ where } s_j = \sum_{i=0}^{n} w_{ij} x_i \text{ and} \tag{1}$$

$$f(s_j) = \frac{1}{1 + e^{-ks_j}} \text{ for } 0 \le f(s_j) \le 1$$

where k is a positive constant that controls the spread of the function.

The sigmoid function acts as an automatic gain control and the steep slope provides a high gain for small signals so that the net can accept large inputs and still remain sensitive to small changes. It is also continuously differentiable with the first derivative as simples function of the output (Equation 2), an important computational consideration in the development of the training algorithm.

$$f'(s_j) = \frac{ke^{-ks_j}}{(1 + e^{-ks_j})^2} = kf(s_j)(1 - f(s_j)) = ko_j(1 - o_j) \tag{2}$$

FIGS. 1a & 1b correspond to a bipolar sigmoid function 6 and a unipolar sigmoid 7 function respectively.

In both functions, As k→∞ the thresholding function tends to 1 (Heaviside function). The back-propagation learning algorithm for MLP ensures that the weights are adapted to reduce the error each time. The solution to classifying carriers is to train a network to obtain a set of weights in the weight space to correspond to two distinct regions in the pattern space. The points in one region represent patterns from class A (digital carriers), identified by thresholding output tending towards '1'; and those in the other region belong to class B (analogue carriers) rejected by thresholding output tending towards '0'.

The architecture of MLP 4 to a large extent is decided by the nature of the problem to be solved. The dimension of the input vector is defined by the coding of input-patterns. In this example, the characteristics and features of the frequency spectral profile constitute the input vector. Likewise, the dimension of the output vector is also decided by the nature of the problem (one output for accepting or rejecting the profile). With these restrictions in mind, it is clear that the hidden layers are the most flexible and therefore an important consideration for the architecture of a network. In general, the size of the network should provide a good match between the structure of the underlying problem and the capability of the network to solve it. The size of the network system should be large enough to form a good model of the problem, and at the same time, small enough to provide a good.

Figure 2:
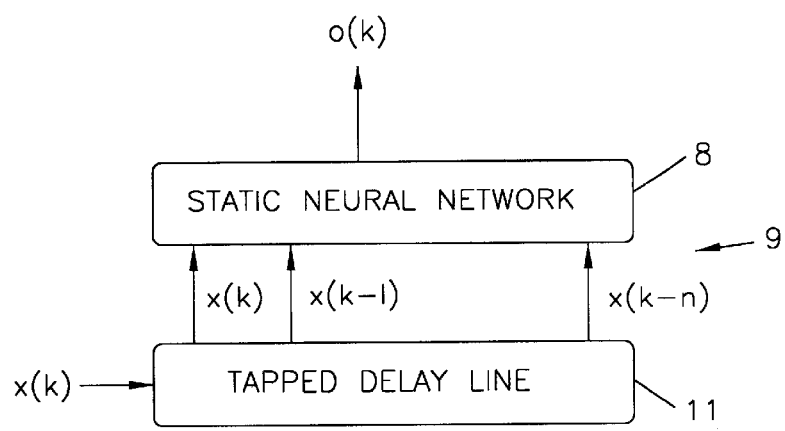
FIG. 2 shows an architecture of the time delay neural network of the present invention.
Figure 3:
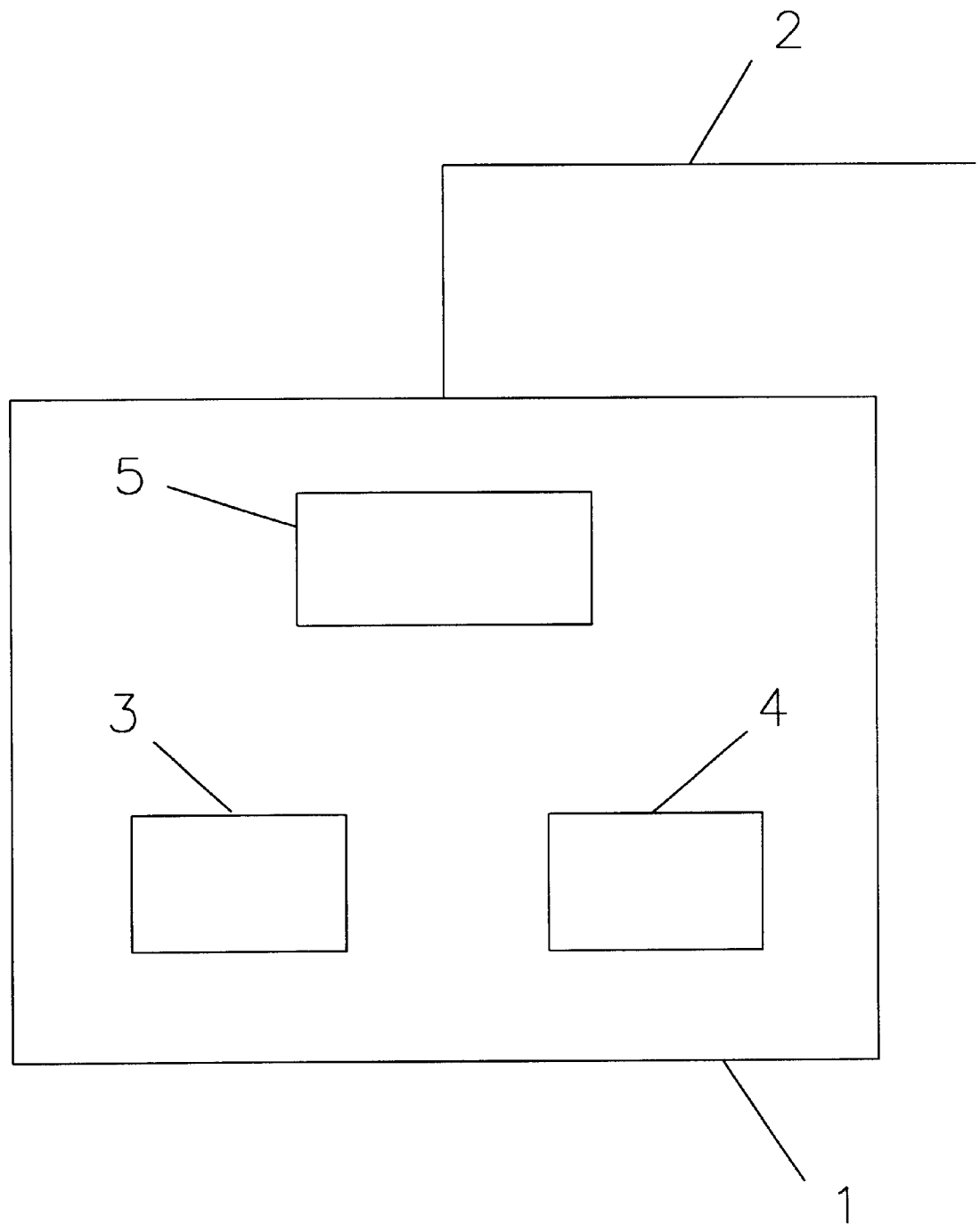
FIG. 3 is a diagrammatic view of the system of the present invention.

The network used for center frequency estimation may be regarded as a semi-dynamic neural network, known as Time Delay Neural Network (TDNN) 9, as seen in FIG. 2, for processing time series data but without feedback. Essentially, a TDNN converts the temporal sequences of input data into a static pattern by treating a finite sequence of time as anther dimension in the problem. As shown in FIG. 2, the input sequence is fed into a tapped delay line 11 of finite extent, which in turn is fed into a static network 8. The output is only a function of the temporal sequences in input, with no feedback. The output thresholding function is again a sigmoid function, but unlike the MLP 4, the gradient of the sigmoid is reduced significantly to accommodate a relatively accurate interpolation capacity. Thus, with reference to FIG. 1, the sloping parameter (k) may be chosen to be 0.5 lower.

In producing the input vector to TDNN 5, an overlapping windowing function is used to extract spectral features progressively. The size and the overlap margin of the frame blocking stage are determined experimentally. This results in an optimum number of parameters that constitute the input vector to the network. The structure of TDNN 5 also incorporates a sliding window that propagates through rows in each layer. To ensure correct propagation of all the rows of coefficients through the network, the number of rows in the hidden layers are dependent on the number of rows and the size of the sliding window in the previous layer. For example, the following general equation is used to determine the number of rows in the first hidden layer:

$$\text{no\_of\_rows}_{\text{first\_hidden\_layer}} = (\text{no\_of\_rows}_{\text{input\_layer}}) - (\text{no\_of\_rows}_{\text{input\_sliding\_window}}) + 1$$

A number of networks will be trained with a combination of window size and overlap margin to yield the optimum architecture. It is important to note that, while the training phase for MLP 4 and TDNN 5 can be computationally intensive and time consuming, the evaluation phase is almost instantaneous.

In an alternative embodiment the use of information data or "look up" tables can be incorporated and in this technique the estimated parameters from the spectral preprocessing stage would be used as an input to a look-up table containing information showing particular digital carrier centre frequency values which are equivalent to the estimated parameters. This then allows an estimated value for the digital carrier centre frequency to be obtained. The system in this embodiment could comprise a pattern recognition process (say MLP 4) for analogue/digital carrier distinction and in the second stage of the technique, instead of a TDNN 5, a look up table can be used for digital carrier estimation.

It will therefore be appreciated that the invention as herein described provides an improved search system which has increased efficiency and is performed in a reduced time and is particularly applicable to the front-end tuner for digital STBs and iDTVs. By providing an intelligent mechanism to distinguish between analogue and digital carriers in digital tuners without the need of exhaustive search routines the time in dealing with analogue carriers is removed. By providing an intelligent mechanism for digital carrier centre frequency estimation an efficient method of local oscillator frequency selection and carrier frequency locking technique is provided and which can in conjunction with the novel use of pattern recognition techniques for spectral analysis in front-end digital tuners allow in many instances the need to search to be removed if the estimation is sufficiently accurate and, if required, the range of search is relatively small.

Figure 4:
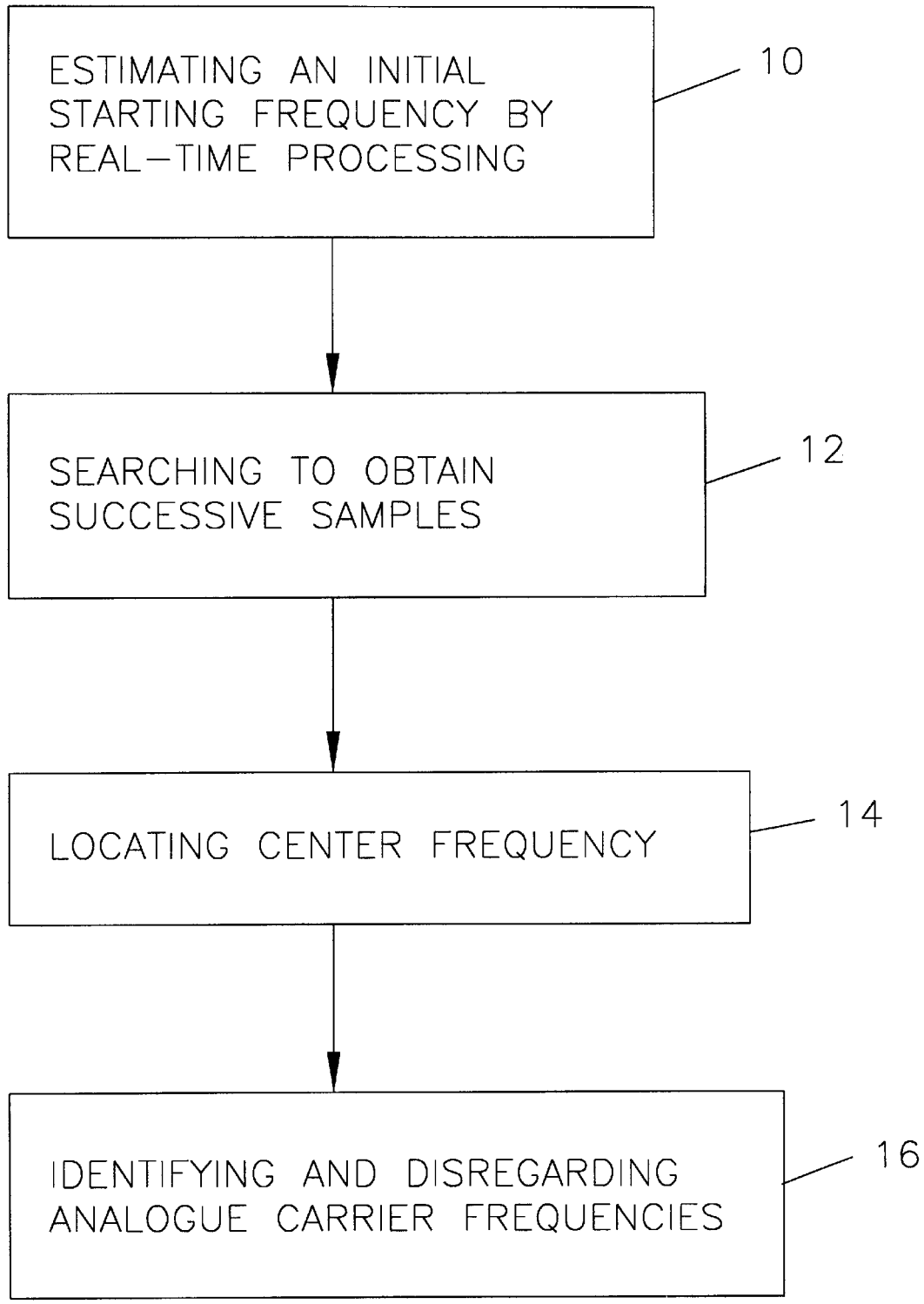
FIG. 4 is a flow diagram depicting the method for searching the frequency range of a device.

FIG. 4 is a flow diagram depicting the method for searching the frequency range of a device. In step 10, the initial starting frequency for a digital carrier by dynamic real-time pre-processing of the spectrum profile is estimated. Then in step 12, successive samples of the frequency range from the start position for the carrier are obtained until, in step 14, the center frequency for the carrier is located. Typically, the start point estimation and search for the location for the center frequency is repeated for each digital carrier in the frequency range.

The subsequent use of center frequency estimation of each digital carrier by overall pattern analysis of their corresponding frequency response also allows a reduction in the search time, as not all of the frequency range needs to be searched in a progressive manner as is currently the case. General pattern recognition techniques can be applied. One example of which is Neurocomputing utilizing neural net techniques as in FIG. 4, step 16, in which the search apparatus and system is pre-programmed to be able to distinguish and reject analogue carrier frequencies which are found in, for example, digital tuners and subsequently estimate the local oscillator locking frequency for the digital carriers. The progressive frequency estimation is achieved by an overlapping windowing function in which the parameters in each overlapping window constitute a subset of the input vector to the system. It should however be clear that any suitable general pattern recognition techniques can be used as required.

The use of the successive samples allows intra-layer propagation of input parameters in each layer to develop an integrated representation of the spectral profile for the digital carrier.

By training the system to recognize and ignore analogue carrier profiles which tend to have a different profile than digital carriers, and then subsequently estimating the initial Local Osc. (LO) frequency for lock within the specified tolerance or very close estimation prior to the search routine and which estimation acts as the start point from which the search begins for each digital carrier, and which functions can be performed simultaneously so the search can be performed more efficiently and quickly than with the conventional searches which progressively move through the frequency range.

One method can predict the center frequency estimations of all digital carriers for respective channels and hence the start position for the search for each digital carrier, prior to the search commencing. Indeed, in one preferred embodiment there need not be search performed for those digital carriers where the estimated center frequency value lies within the tolerances of the predesignated center frequency value for that carrier.

The system of this invention therefore reduces the possibility of locking to analogue carriers, and has the potential of significantly reducing the time required to perform a search in comparison to the current digital carrier frequency "search & lock" procedure.

A simpler technique can be utilized which involves the use of the estimated parameters in the process to refer to a table of information and, from that information the estimated digital carrier frequency value can be obtained. These tables of information are generally known as "look-up" tables.

Another method is directed toward searching the frequency range of a digital data receiving device. As seen in step 10 of FIG. 4, the initial starting frequency for a digital carrier in the range by dynamic real-time pre-processing of the spectrum profile is estimated. Step 14 includes locating the center frequency for the carrier. In step 16, analogue carrier frequencies in the range are identified and disregarded.

Typically by first distinguishing between analogue and digital carriers and ignoring or rejecting the analogue carriers, the time for the search of the frequency range can be considerably reduced.

While the invention has been described with a certain degree of particularly, it is manifest that many changes may be made in the details of construction and the arrangement of components without departing from the spirit and scope of this disclosure. It is understood that the invention is not limited to the embodiments set forth herein for purposes of exemplification, but is to be limited only b the scope of the attached claim or claims, including the full range of equivalency to which each element.

What is claimed is:

1. A method for searching the frequency range of a digital data receiving device, said method comprising the steps of:
   estimating an initial starting frequency for at least one digital carrier in the frequency range of the digital data receiving device by dynamic real-time pre-processing of a frequency spectrum profile;
   searching to obtain successive samples of the frequency range from the estimated initial starting frequency position for the at least one digital carrier until a center frequency for the at least one digital carrier is located; and
   locating the center frequency for the at least one digital carrier and identifying and disregarding analogue carrier frequencies in the frequency range.

2. A method for searching the frequency range of a digital data receiving device in accordance with claim 1 wherein the estimated initial starting frequency and search for the location for the center frequency is repeated for each of said at least one digital carrier in the frequency range.

3. A method for searching the frequency range of a digital data receiving device in accordance with claim 1 wherein pattern recognition techniques are employed.

4. A method for searching the frequency range of a digital data receiving device in accordance with claim 3 wherein a neurocomputing technique utilizing a neural net which has the capabilities of learning by trial and error is used in which a search apparatus and system is pre-programmed to be able to distinguish and reject analogue carrier frequencies which are found and subsequently estimate a local oscillator locking frequency for the at least one digital carriers.

5. A method for searching the frequency range of a digital data receiving device in accordance with claim 4 wherein progressive frequency estimation is achieved by an overlapping windowing function in which the parameters in each overlapping window constitute a subset of an input vector to the search system.

6. A method for searching the frequency range of a digital data receiving device in accordance with claim 1 wherein said method includes the step of predicting center frequency estimations of the identified said at least one digital carrier for respective channels in the frequency range prior to a search commencing.

7. A method for searching the frequency range of a digital data receiving device in accordance with claim 6 wherein for those digital carriers where the estimated center frequency lies within tolerances of a predesignated center frequency for that at least one digital carrier, no search is performed.

8. A method for searching the frequency range of a digital data receiving device in accordance with claim 1 wherein estimated parameters in the pre-processing of the frequency spectrum profile are stored/retrieved in a table of information and, from that information an estimated digital carrier frequency is obtained.

* * * * *